(12) United States Patent
Yoshida

(10) Patent No.: US 8,844,545 B2
(45) Date of Patent: Sep. 30, 2014

(54) TREATMENT LIQUID SUPPLY APPARATUS AND SUBSTRATE TREATMENT APPARATUS INCLUDING THE SAME

(75) Inventor: Hiroshi Yoshida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 364 days.

(21) Appl. No.: 12/370,023

(22) Filed: Feb. 12, 2009

(65) Prior Publication Data

US 2009/0229641 A1 Sep. 17, 2009

(30) Foreign Application Priority Data

Mar. 11, 2008 (JP) .................................. 2008-61057

(51) Int. Cl.
B08B 3/00 (2006.01)
H01L 21/67 (2006.01)
B08B 3/02 (2006.01)

(52) U.S. Cl.
CPC ............ *B08B 3/02* (2013.01); *H01L 21/67017* (2013.01); *H01L 21/67248* (2013.01); *B08B 3/00* (2013.01)
USPC ........................................................ 134/107

(58) Field of Classification Search
None
See application file for complete search history.

(56) References Cited

U.S. PATENT DOCUMENTS

| 5,948,140 A | * | 9/1999 | Vodrahalli | ...................... 75/710 |
| 6,589,338 B1 | | 7/2003 | Nakamori et al. | |
| 2007/0161248 A1 | * | 7/2007 | Christenson et al. | ......... 438/689 |
| 2008/0295874 A1 | * | 12/2008 | Tang et al. | .................. 134/57 R |

FOREIGN PATENT DOCUMENTS

| JP | 62-237991 | 10/1987 |
| JP | 2001-160546 | 6/2001 |
| JP | 2004-273838 | 9/2004 |
| JP | 2006-351709 | 12/2006 |
| JP | 2007-273791 | 10/2007 |

OTHER PUBLICATIONS

Notification of Reasons for Refusal issued May 31, 2012 in corresponding Japanese Patent Application No. 2008-061057.

* cited by examiner

*Primary Examiner* — Jason Ko

(74) *Attorney, Agent, or Firm* — Ostrolenk Faber LLP

(57) ABSTRACT

A treatment liquid supply apparatus supplies a treatment liquid to a predetermined object for treatment of a substrate, and recovers the supplied treatment liquid for reuse. The apparatus includes: a first tank in which the treatment liquid to be supplied to the object is stored; a second tank in which the treatment liquid recovered from the object is stored; a transfer unit which transfers the treatment liquid from the second tank to the first tank; a first temperature regulating unit which regulates the temperature of the treatment liquid to be supplied from the first tank to the object; and a second temperature regulating unit which regulates the temperature of the treatment liquid to be transferred from the second tank to the first tank by the transfer unit.

7 Claims, 3 Drawing Sheets

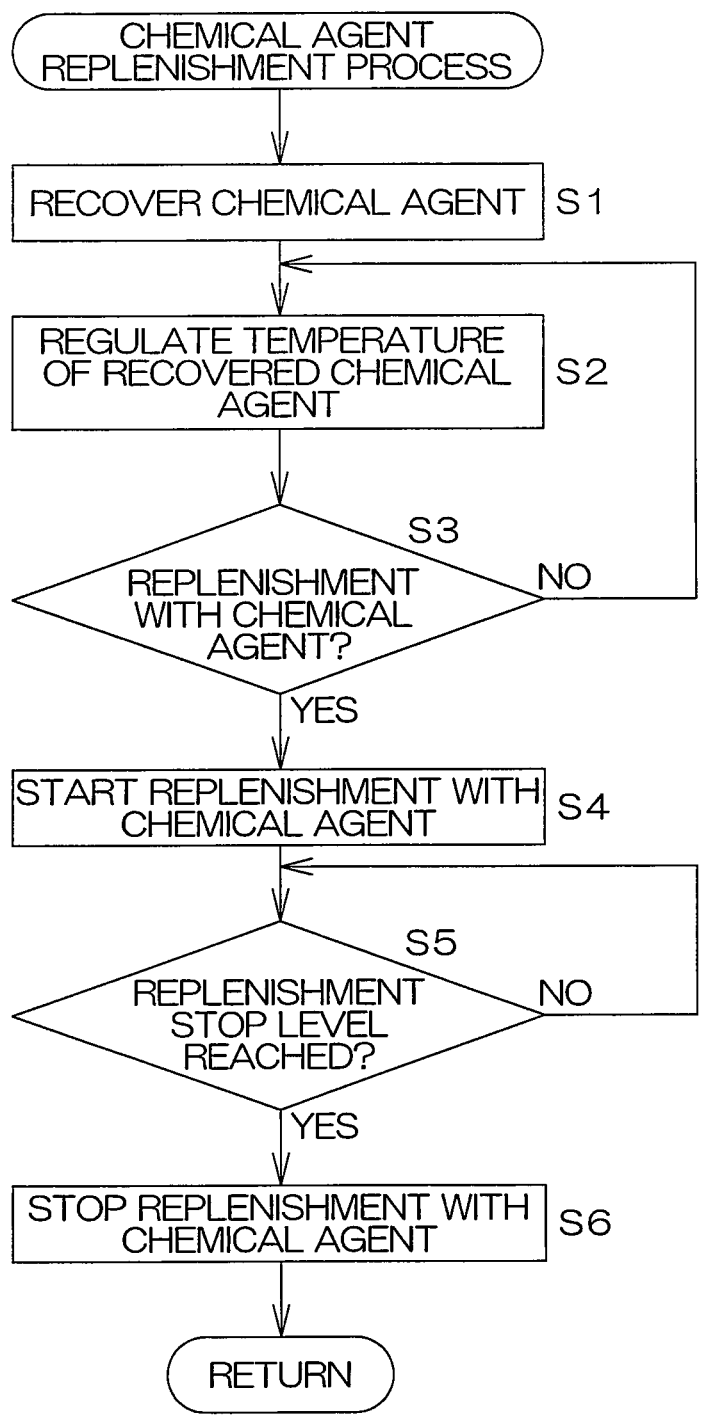

TREATMENT LIQUID SUPPLY APPARATUS AND SUBSTRATE TREATMENT APPARATUS INCLUDING THE SAME

BACKGROUND OF THE INVENTION

1. Field of the Invention

The present invention relates to a treatment liquid supply apparatus which supplies a treatment liquid to a predetermined object for treatment of a substrate and recovers the supplied treatment liquid for reuse, and to a substrate treatment apparatus including such a treatment liquid supply apparatus. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, and substrates for photo masks.

2. Description of the Related Art

In production processes for semiconductor devices and liquid crystal display devices, substrate treatment apparatuses are typically employed, which are adapted to treat a substrate such as a semiconductor wafer with a treatment liquid. A substrate treatment apparatus of a single substrate treatment type for treating a single substrate at a time, for example, includes a spin chuck which horizontally holds and rotates the substrate, and a treatment liquid nozzle which spouts a treatment liquid toward the substrate held by the spin chuck. A treatment liquid supply pipe extending from a treatment liquid supply apparatus is connected to the treatment liquid nozzle. The treatment liquid is supplied from a treatment liquid tank of the treatment liquid supply apparatus through the treatment liquid supply pipe (see, for example, Japanese Unexamined Patent Publication No. 2006-351709).

In the treatment liquid supply apparatus disclosed in Japanese Unexamined Patent Publication No. 2006-351709, a three-way valve which permits and prohibits the supply of the treatment liquid to the treatment liquid nozzle and a temperature regulator which regulates the temperature of the treatment liquid flowing through the treatment liquid supply pipe are provided in the treatment liquid supply pipe. A return pipe through which the treatment liquid supplied into the treatment liquid supply pipe is fed back to the treatment liquid tank is connected to the three-way valve. The treatment liquid supply pipe, the three-way valve and the return pipe define a circulation passage through which the treatment liquid from the treatment liquid tank is circulated. When the treatment liquid is not supplied to the treatment liquid nozzle, the treatment liquid from the treatment liquid tank is circulated through the circulation passage. Thus, the temperature of the treatment liquid from the treatment liquid tank is regulated by the temperature regulator, so that the liquid temperature in the treatment liquid tank is maintained at a predetermined temperature level.

A treatment liquid recovery pipe extending from the treatment liquid tank is connected to the substrate treatment apparatus. The treatment liquid supplied from the treatment liquid nozzle to the substrate is recovered in the treatment liquid tank through the treatment liquid recovery pipe. The treatment liquid recovered in the treatment liquid tank is supplied again to the treatment liquid nozzle to be supplied to the substrate. Thus, the recovered treatment liquid is reused.

The temperature of the treatment liquid to be recovered in the treatment liquid tank is generally different from that of the treatment liquid to be fed out of the treatment liquid tank toward the treatment liquid nozzle. Therefore, the liquid temperature in the treatment liquid tank is temporarily changed when the treatment liquid is recovered in the treatment liquid tank. However, if the liquid temperature in the treatment liquid tank is changed during the supply of the treatment liquid to the treatment liquid nozzle, the temperature of the treatment liquid to be supplied to the substrate is deviated from an intended temperature level. Therefore, where the treatment to be performed on the substrate is dependent upon the temperature of the treatment liquid, for example, it is impossible to treat the substrate as intended, resulting in a treatment failure.

SUMMARY OF THE INVENTION

It is an object of the present invention to provide a treatment liquid supply apparatus which is capable of supplying a treatment liquid at a stable temperature to a predetermined object, and to provide a substrate treatment apparatus including the treatment liquid supply apparatus.

A treatment liquid supply apparatus according to the present invention is adapted to supply a treatment liquid to a predetermined object for treatment of a substrate and recover the supplied treatment liquid for reuse. The treatment liquid supply apparatus includes: a first tank in which the treatment liquid to be supplied to the object is stored; a second tank in which the treatment liquid recovered from the object is stored; a transfer unit which transfers the treatment liquid from the second tank to the first tank; a first temperature regulating unit which regulates the temperature of the treatment liquid to be supplied from the first tank to the object; and a second temperature regulating unit which regulates the temperature of the treatment liquid to be transferred from the second tank to the first tank by the transfer unit.

The first temperature regulating unit may regulate the temperature of the treatment liquid in a treatment liquid supply pipe through which the treatment liquid flows to be supplied to the object from the first tank, or may regulate the temperature of the treatment liquid stored in the first tank. Similarly, the second temperature regulating unit may regulate the temperature of the treatment liquid in a treatment liquid transfer pipe through which the treatment liquid flows to be transferred from the second tank to the first tank, or may regulate the temperature of the treatment liquid stored in the second tank. The first and second temperature regulating units may regulate the temperature of the treatment liquid by heating, or may regulate the temperature of the treatment liquid by cooling.

According to the present invention, the treatment liquid to be used for the treatment of the substrate can be stored in the first tank, and the treatment liquid can be supplied to the predetermined object from the first tank with the temperature thereof being regulated at a predetermined first temperature level by the first temperature regulating unit. Further, the treatment liquid supplied to the object can be recovered, and the recovered treatment liquid can be reused. That is, the treatment liquid supplied to the object is recovered and stored in the second tank. Further, the treatment liquid recovered in the second tank is transferred to the first tank by the transfer unit, and then supplied again to the object from the first tank. The temperature of the treatment liquid to be transferred from the second tank to the first tank is regulated at a predetermined second temperature level by the second temperature regulating unit. The second temperature level is herein defined to be closer to the first temperature level than the temperature of the recovered treatment liquid.

The treatment liquid recovered in the second tank is transferred to the first tank by the transfer unit with its temperature being regulated by the second temperature regulating unit.

That is, the recovered treatment liquid is fed into the first tank after the temperature thereof is preliminarily regulated. This suppresses significant temperature change of the treatment liquid which may otherwise occur in the first tank due to the recovered treatment liquid. Therefore, the treatment liquid can be supplied to the object at the stable temperature.

That is, where the first temperature regulating unit is adapted to regulate the temperature of the treatment liquid stored in the first tank, the liquid temperature in the first tank is maintained at the first temperature level, so that the temperature of the treatment liquid to be supplied to the object is stabilized. Further, where the first temperature regulating unit is adapted to regulate the temperature of the treatment liquid in the treatment liquid supply pipe, the temperature of the treatment liquid can be immediately adjusted at the first temperature level in the treatment liquid supply pipe, because the temperature of the treatment liquid supplied to the treatment liquid supply pipe from the first tank is closer to the first temperature level. Thus, the temperature of the treatment liquid to be supplied to the object is stabilized.

The second temperature level at which the treatment liquid is temperature-regulated by the second temperature regulating unit is preferably equal to or substantially equal to the first temperature level at which the treatment liquid is temperature-regulated by the first temperature regulating unit. That is, the first and second temperature regulating units are preferably adapted to regulate the temperature of the treatment liquid at the same temperature level or at substantially the same temperature level. In this case, the temperature of the treatment liquid to be transferred from the second tank to the first tank can be maintained at a temperature that is equal to or substantially equal to the first temperature level. Therefore, the temperature of the treatment liquid to be supplied to the object can be further stabilized.

The treatment liquid supply apparatus preferably further includes a fresh liquid replenishment unit which replenishes the second tank with a fresh treatment liquid.

With this arrangement, the second tank can be replenished with the fresh treatment liquid by the fresh liquid replenishment unit. Thus, the amount of the treatment liquid in the second tank can be maintained greater than a predetermined level. Further, even if the temperature of the treatment liquid supplied into the second tank by the fresh liquid replenishment unit is different from the first temperature level, the supplied treatment liquid can be transferred to the first tank with its temperature kept closer to the first temperature level by regulating the temperature of the treatment liquid by means of the second temperature regulating unit. Thus, the treatment liquid can be supplied to the object at the stable temperature.

The first and second temperature regulating units are preferably each adapted to regulate the temperature of the treatment liquid at a temperature level not lower than a room temperature. With this arrangement, the temperature levels at which the temperature of the treatment liquid is regulated by the first and second temperature regulating units are not lower than the room temperature (about 25° C.). That is, the first and second temperature levels are not lower than the room temperature, and the treatment liquid is supplied to the object with its temperature being regulated at a level not lower than the room temperature. Therefore, the treatment liquid supplied to the object is recovered at a temperature not higher than the first temperature level, unless otherwise being subjected to a temperature regulating operation or the like. Therefore, the reduction of the liquid temperature in the first tank is suppressed or prevented by regulating the temperature of the treatment liquid transferred from the second tank to the first tank by means of the second temperature regulating unit. Thus, the treatment liquid can be supplied to the object at the stable temperature.

The treatment liquid supply apparatus preferably further includes a filter unit which filters the treatment liquid to be transferred from the second tank to the first tank by the transfer unit.

With this arrangement, the treatment liquid to be transferred from the second tank to the first tank can be filtered by the filter unit. Thus, foreign matter such as particles contained in the treatment liquid recovered from the object can be removed from the treatment liquid. Thus, the treatment liquid containing the foreign matter is substantially prevented from being transferred to the first tank and then supplied to the object from the first tank. Since the treatment liquid free from the foreign matter is transferred to the first tank, contamination of the first tank with the foreign matter can be suppressed or prevented.

A substrate treatment apparatus according to the present invention includes the aforementioned treatment liquid supply apparatus and a treatment section serving as the object, wherein a substrate is treated by supplying a treatment liquid fed from the treatment liquid supply apparatus to the substrate in the treatment section.

With this arrangement, the treatment liquid is supplied from the treatment liquid supply apparatus to the treatment section serving as the object, and further supplied to the substrate in the treatment section, whereby the substrate is treated with the treatment liquid.

As described above, the treatment liquid is supplied to the treatment section from the treatment liquid supply apparatus at a stable temperature. Therefore, even if the treatment to be performed on the substrate is dependent upon the temperature of the treatment liquid, for example, the substrate can be properly treated. This suppresses or prevents the substrate treatment failure.

The foregoing and other objects, features and effects of the present invention will become more apparent from the following detailed description of the preferred embodiments with reference to the attached drawings.

BRIEF DESCRIPTION OF THE DRAWINGS

FIG. 3 is a flow chart for explaining a chemical agent replenishment process for replenishing a first tank with a chemical agent in a chemical agent supply apparatus.

DETAILED DESCRIPTION OF PREFERRED EMBODIMENTS

Figure 1:
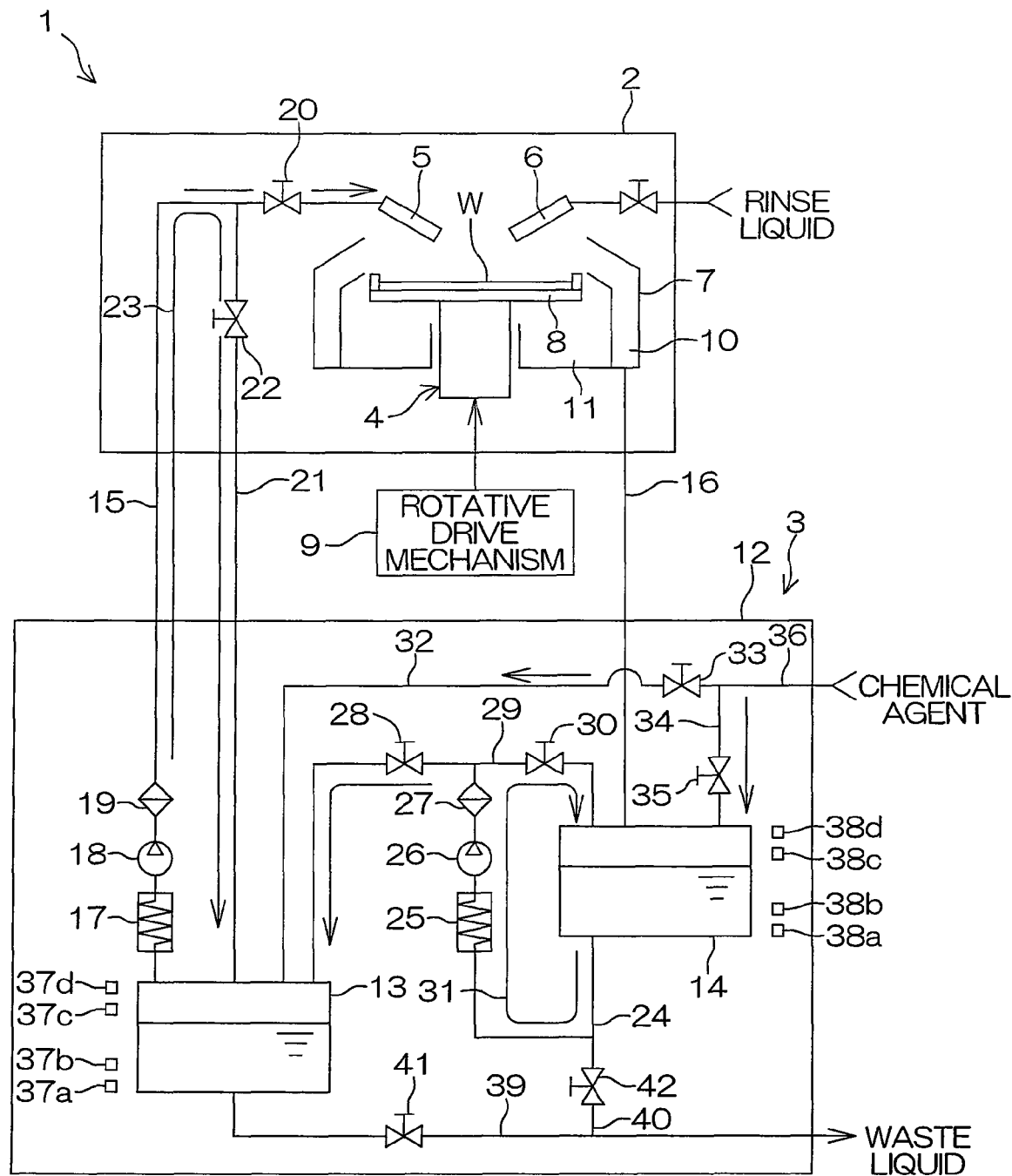
FIG. 1 is a schematic diagram for explaining the construction of a substrate treatment apparatus according to one embodiment of the present invention.

FIG. 1 is a schematic diagram for explaining the construction of a substrate treatment apparatus 1 according to one embodiment of the present invention. The substrate treatment apparatus 1 is of a single substrate treatment type which is adapted to treat a single semiconductor wafer W (an exemplary substrate hereinafter referred to simply as "wafer W") at a time. The substrate treatment apparatus 1 includes a treatment unit 2 (an object or a treatment section) which treats the wafer W, and a treatment liquid supply unit 3 which supplies a treatment liquid to the treatment unit 2. In FIG. 1, a single treatment unit 2 is illustrated, but a plurality of treatment units 2 may be provided. Correspondingly, a plurality of treatment liquid supply units 3 may be provided.

The treatment unit 2 includes a spin chuck 4 which horizontally holds and rotates the wafer W, a chemical agent nozzle 5 which supplies a chemical agent as the treatment liquid to the wafer W, a rinse liquid nozzle 6 which supplies a rinse liquid as the treatment liquid to the wafer W, and a cup 7 which receives the treatment liquid flowing out of the wafer W. The spin chuck 4 includes a spin base 8 which is rotatable about a vertical axis with the wafer W held generally horizontally, and a rotative drive mechanism 9 which rotates the spin base 8 about the vertical axis. The chemical agent nozzle 5 and the rinse liquid nozzle 6 may each be a stationary nozzle which supplies the treatment liquid to a fixed liquid application position on the wafer W, or may each be a scan nozzle which scans the treatment liquid application position in a range from a rotation center of the wafer W to a periphery of the wafer W. The cup 7 has an annular shape to surround the spin chuck 4. The cup 7 includes a chemical liquid collecting section 10 in which the chemical agent is collected, and a rinse liquid collecting section 11 in which the rinse liquid is collected. The chemical agent and the rinse liquid are respectively collected in the chemical agent collecting section 10 and the rinse liquid collecting section 11.

The treatment liquid supply unit 3 includes a chemical agent supply apparatus 12 (treatment liquid supply apparatus). The chemical liquid supply apparatus 12 includes a first tank 13 and a second tank 14 which store the same chemical agent, a chemical agent supply pipe 15 (treatment liquid supply pipe) through which the chemical agent is supplied to the chemical agent nozzle 5, and a chemical agent recovery pipe 16 through which the chemical agent received in the cup 7 is recovered. The chemical agent is supplied to the chemical agent nozzle 5 from the first tank 13 through the chemical agent supply pipe 15.

The chemical agent supply pipe 15 is connected to the chemical agent nozzle 5 at one end thereof, and connected to the first tank 13 at the other end thereof. A first heater 17 (first temperature regulating unit), a first pump 18, a first filter 19 and a chemical agent valve 20 are provided in this order with respect to a chemical agent flowing direction in the chemical agent supply pipe 15. The first heater 17 is capable of regulating the temperature of the chemical agent flowing through the chemical agent supply pipe 15. The first pump 18 is capable of pumping up the chemical agent from the first tank 13 to feed the chemical agent into the chemical agent supply pipe 15. The first pump 18 is constantly driven to constantly pump up the chemical agent from the first tank 13. The first filter 19 is capable of filtering away foreign matter from the chemical agent flowing through the chemical agent supply pipe 15. The chemical agent valve 20 permits and prohibits the supply of the chemical agent to the chemical agent nozzle 5.

A first return pipe 21 through which the chemical agent flowing through the chemical agent supply pipe 15 is fed back into the first tank 13 is branched from the chemical agent supply pipe 15 upstream of the chemical agent valve 20 with respect to the chemical agent flowing direction. A first return valve 22 is provided in the first return pipe 21. The chemical agent supply pipe 15 and the first return pipe 21 define a first circulation passage 23 through which the chemical agent from the first tank 13 is circulated.

When the chemical agent valve 20 is opened and the first return valve 22 is closed with the first pump 18 being driven, the chemical agent pumped up from the first tank 13 is supplied to the chemical agent nozzle 5 through the first heater 17, the first filter 19 and the chemical agent valve 20. Thus, the chemical agent is spouted from the chemical agent nozzle 5.

When the chemical agent valve 20 is closed and the first return valve 22 is opened with the first pump 18 being driven, the chemical agent pumped up from the first tank 13 is fed back into the first tank 13 through the first heater 17, the first filter 19, the first return valve 22 and the first return pipe 21. Thus, the chemical agent from the first tank 13 is circulated through the first circulation passage 23.

By thus circulating the chemical agent from the first tank 13 through the first circulation passage 23, the temperature of the chemical agent is regulated by the first heater 17 to be maintained at a predetermined first temperature level that is suitable for the treatment of the wafer W. Further, the chemical agent from the first tank 13 is filtered by the first filter 19 when being circulated through the first circulation passage 23, whereby particles and like foreign matter are removed from the chemical agent. Thus, the chemical agent containing the foreign matter is substantially prevented from being supplied to the chemical agent nozzle 5. Therefore, the contamination of the wafer W with the foreign matter is suppressed or prevented, which may otherwise occur when the chemical agent containing the foreign matter is supplied to the wafer W.

On the other hand, the chemical agent recovery pipe 16 is connected to a bottom of the cup 7 (chemical agent collecting section 10) at one end thereof, and connected to the second tank 14 at the other end thereof. The chemical agent received in the cup 7 is introduced into the second tank 14 through the chemical agent recovery pipe 16 and stored in the second tank 14. Further, the second tank 14 is connected to the first tank 13 through a chemical agent transfer pipe 24 (treatment liquid transfer pipe). The chemical agent is pumped out of the second tank 14 by a second pump 26 (transfer unit) provided in the chemical agent transfer pipe 24, and transferred to the first tank 13.

The chemical agent transfer pipe 24 is connected to a lower portion of the second tank 14 at one end thereof, and connected to an upper portion of the first tank 13 at the other end thereof. A second heater 25 (second temperature regulating unit), the second pump 26, a second filter 27 (filter unit) and a transfer valve 28 are provided in this order with respect to a chemical agent flowing direction in the chemical agent transfer pipe 24. The second heater 25 is capable of regulating the temperature of the chemical agent flowing through the chemical agent transfer pipe 24. The second pump 26 is capable of pumping up the chemical agent from the second tank 14 to feed the chemical agent into the chemical agent transfer pipe 24. The second pump 26 is constantly driven to constantly pump up the chemical agent from the second tank 14. The second filter 27 is capable of filtering away foreign matter from the chemical agent flowing through the chemical agent transfer pipe 24. The transfer valve 28 permits and prohibits the transfer of the chemical agent to the first tank 13.

A second return pipe 29 through which the chemical agent flowing through the chemical agent transfer pipe 24 is fed back into the second tank 14 is branched from the chemical agent transfer pipe 24 upstream of the transfer valve 28 with respect to the chemical agent flowing direction. A second return valve 30 is provided in the second return pipe 29. The chemical agent transfer pipe 24 and the second return pipe 29 define a second circulation passage 31 through which the chemical agent from the second tank 14 is circulated.

When the transfer valve 28 is opened and the second return valve 30 is closed with the second pump 26 being driven, the chemical agent pumped out of the second tank 14 is transferred to the first tank 13 through the second heater 25, the second filter 27 and the transfer valve 28. Thus, the first tank 13 is replenished with the chemical agent.

When the transfer valve 28 is closed and the second return valve 30 is opened with the second pump 26 being driven, the chemical agent pumped out of the second tank 14 is fed back into the second tank 14 through the second heater 25, the second filter 27, the second return valve 30 and the second return pipe 29. Thus, the chemical agent from the second tank 14 is circulated through the second circulation passage 31.

By thus circulating the chemical agent from the second tank 14 through the second circulation passage 31, the temperature of the chemical agent is regulated by the second heater 25 to be maintained at a predetermined second temperature level. For example, the second temperature level is equal to or substantially equal to the first temperature level (e.g., slightly lower or higher than the first temperature level). Further, the chemical agent from the second tank 14 is filtered by the second filter 27 when being circulated through the second circulation passage 31, whereby particles and like foreign matter are removed from the chemical agent. Thus, the chemical agent containing the foreign matter is substantially prevented from being supplied into the first tank 13. Since the supply of the chemical agent containing the foreign matter is substantially prevented, the contamination of the first tank 13 with the foreign matter contained in the chemical agent is suppressed or prevented. The recovered chemical agent to be introduced into the second tank 14 contains a greater amount of foreign matter than a fresh chemical agent (unused chemical agent). Therefore, the introduction of the foreign matter into the first tank 13 is reliably suppressed or prevented by filtering the chemical agent supplied from the second tank 14 by means of the second filter 27.

A first chemical agent replenishment pipe 32 for replenishing the first tank 13 with the fresh chemical agent is connected to the first tank 13. A first replenishment valve 33 is provided in the first chemical agent replenishment pipe 32. The supply of the fresh chemical agent to the first tank 13 is permitted or prohibited by opening or closing the first replenishment valve 33. Similarly, a second chemical agent replenishment pipe 34 (fresh liquid replenishment unit) for replenishing the second tank 14 with the fresh chemical agent is connected to the second tank 14. A second replenishment valve 35 is provided in the second chemical agent replenishment pipe 34. The supply of the fresh chemical agent to the second tank 14 is permitted and prohibited by opening and closing the second replenishment valve 35. The first and second chemical agent replenishment pipes 32, 34 are connected to a central pipe 36 which is connected to a chemical agent supply source not shown.

The first tank 13 is replenished with the fresh chemical agent when both the first tank 13 and the second tank 14 are empty. The second tank 14 is replenished with the fresh chemical agent when both the first tank 13 and the second tank 14 are empty or when the amount of the chemical agent in the second tank 14 is not greater than a predetermined level. A plurality of liquid surface level sensors (liquid surface level sensors 37a to 37d) are provided at different height levels in the first tank 13. The surface level of the chemical agent in the first tank 13 is detected by these liquid surface level sensors 37. Further, a plurality of liquid surface level sensors 38 (liquid surface level sensors 38a to 38d) are provided at different height levels in the second tank 14. The surface level of the chemical agent in the second tank 14 is detected by these liquid surface level sensors 38.

In the tanks 13, 14, the lowermost liquid surface level sensors 37a, 38a each detect the lower limit surface level of the chemical agent. If the liquid surface level is lower than the lower limit surface level, the substrate treatment apparatus 1 and the chemical agent supply apparatus 12 halt their operations. The uppermost liquid surface level sensors 37d, 38d each detect the upper limit surface level of the chemical agent in the tank 13, 14. If the liquid surface level is higher than the upper limit surface level, the substrate treatment apparatus 1 and the chemical agent supply apparatus 12 halt their operations. The second lowest liquid surface level sensors 37b, 38b each detect a chemical agent replenishment surface level, and the third lowest liquid surface level sensors 37c, 38c each detect a chemical agent replenishment stop surface level.

If the liquid surface level in the first tank 13 is lowered to the chemical agent replenishment surface level when the chemical agent is supplied to the chemical agent nozzle 5 from the first tank 13, the second return valve 30 is closed and the transfer valve 28 is opened to transfer the chemical agent from the second tank 14 to the first tank 13 by the second pump 26. Thus, the first tank 13 is replenished with the chemical agent. The transfer of the chemical agent from the second tank 14 to the first tank 13 lasts until the liquid surface level in the first tank 13 reaches the chemical agent replenishment stop surface level. Thus, the liquid surface level in the first tank 13 is maintained between the surface levels to be detected by the liquid surface level sensors 37b and 37c.

If the liquid surface level in the second tank 14 is lowered to the chemical agent replenishment surface level, the second replenishment valve 35 provided in the second chemical agent replenishment pipe 34 is opened to replenish the second tank 14 with the fresh chemical agent. The replenishment of the second tank 14 with the fresh chemical agent is effected, for example, when the chemical agent is not transferred from the second tank 14 to the first tank 13. That is, if the liquid surface level in the second tank 14 is lowered to the chemical agent replenishment surface level during the transfer of the chemical agent from the second tank 14 to the first tank 13, the replenishment of the second tank 14 with the fresh chemical agent is not effected until the chemical agent surface level in the first tank 13 reaches the chemical agent replenishment stop surface level. After the transfer of the chemical agent to the first tank 13 is completed, the second replenishment valve 35 is opened to replenish the second tank 14 with the fresh chemical agent. The replenishment of the second tank 14 with the chemical agent lasts until the liquid surface level in the second tank 14 reaches the chemical agent replenishment stop surface level.

A first drain pipe 39 and a second drain pipe 40 are respectively connected to the first tank 13 and the second tank 14 for draining the chemical agent from the tanks 13, 14. The first drain pipe 39 is connected to a lower portion of the first tank 13 at one end thereof, and connected to a drain tank (not shown) at the other end thereof. A first drain valve 41 is provided in the first drain pipe 39. With the first drain valve 41 being open, the chemical agent flows down into the first drain pipe 39 from the first tank 13 to be drained. The first drain valve 41 is constantly closed, but is opened, for example, for maintenance of the first tank 13 or for replacement of the used chemical agent with the fresh chemical agent in the first tank 13.

The second drain pipe 40 is connected to a lower portion of the second tank 14 at one end thereof, and connected at the other end thereof to a portion of the first drain pipe 39 downstream of the first drain valve 41 with respect to a chemical agent flowing direction. A second drain valve 42 is provided in the second drain pipe 40. With the second drain valve 42 being open, the chemical agent flows down into the second drain pipe 40 from the second tank 14 to be drained. The second drain valve 42 is constantly closed, but is opened, for example, for maintenance of the second tank 14 or for replacement of the used chemical agent with the fresh chemical agent in the second tank 14.

Figure 2:
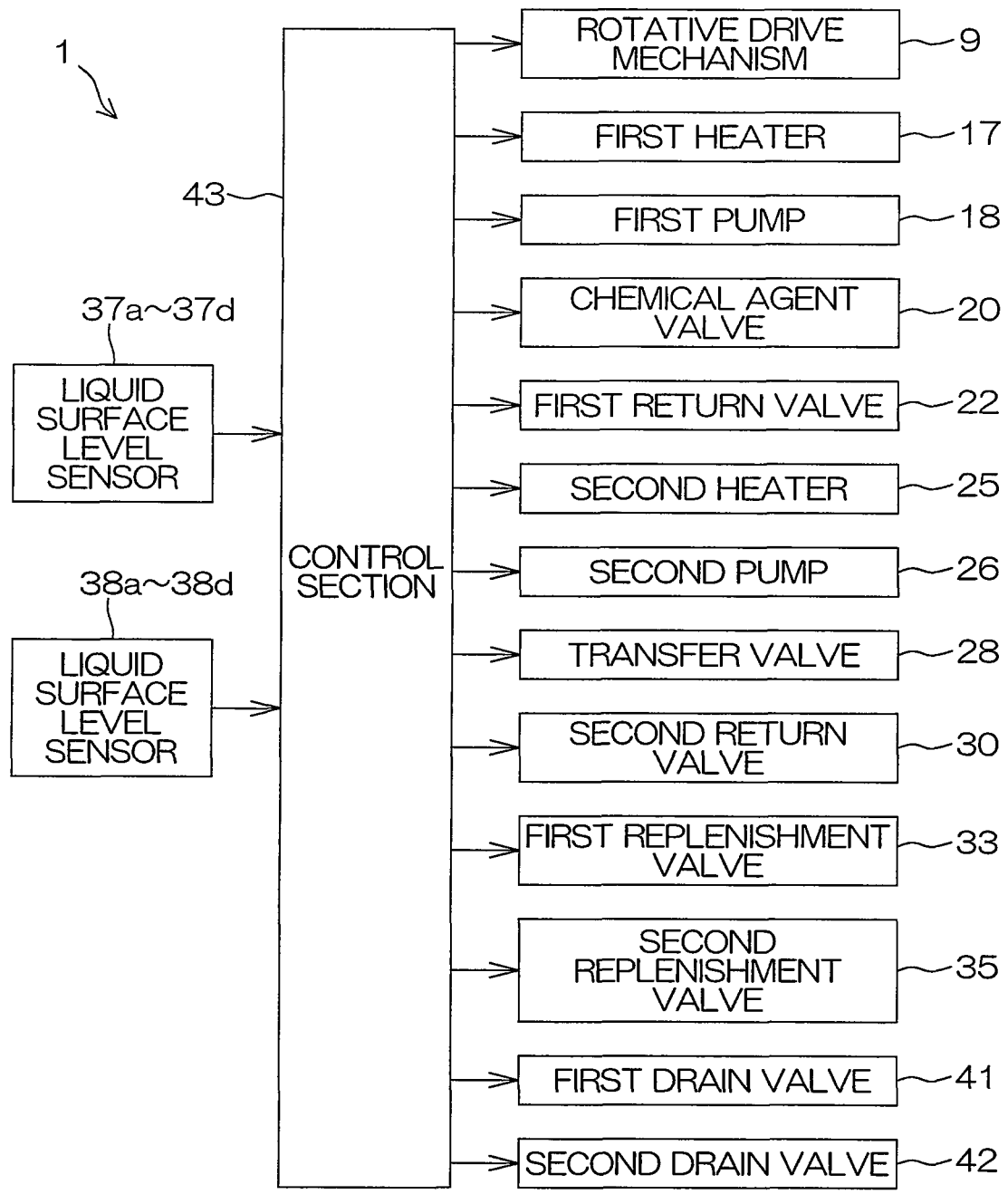
FIG. 2 is a block diagram for explaining the electrical construction of the substrate treatment apparatus.

FIG. 2 is a block diagram for explaining the electrical construction of the substrate treatment apparatus 1.

The substrate treatment apparatus 1 includes a control section 43 including a microcomputer. The rotative drive mechanism 9, the first and second heaters 17, 25, the first and second pumps 18, 26, the chemical agent valve 20, the first and second return valves 22, 30, the transfer valve 28, the first and second replenishment valves 33, 35, and the first and second drain valves 41, 42 are connected as control objects to the control section 43. Further, signals from the liquid surface level sensors 37a to 37d and 38a to 38d are inputted to the control section 43.

Next, an exemplary wafer treatment to be performed by the substrate treatment apparatus 1 will be described with reference to FIGS. 1 and 2.

An untreated wafer W is transported into the treatment unit 2 by a substrate transport robot (not shown), and transferred to the spin chuck 4. After hands of the substrate transport robot move out of the treatment unit 2, the spin base 8 is rotated by the rotative drive mechanism 9. Thus, the wafer W held by the spin base 8 is rotated about the vertical axis.

Upon start of the rotation of the wafer W about the vertical axis, the control section 43 opens the chemical agent valve 20 with the first return valve 22 being closed, whereby the chemical agent is supplied to the chemical agent nozzle 5 from the first tank 13 of the chemical agent supply apparatus 12. Thus, the chemical agent is spouted from the chemical agent nozzle 5 to be applied onto a portion of an upper surface (front surface) of the wafer W including the rotation center of the wafer W. The chemical agent applied onto the wafer W receives a centrifugal force generated by the rotation of the wafer W to spread toward the periphery of the wafer W. Thus, the chemical agent is supplied over the entire upper surface of the wafer W, whereby a chemical agent treatment is performed to treat the upper surface of the wafer W with the chemical agent.

A chemical agent having an improved treatment capability at a higher temperature (a temperature higher than a room temperature), for example, is used as the chemical agent to be supplied to the chemical agent nozzle 5. More specifically, TMAH (tetramethylammonium hydroxide) is used as a chemical agent for a polymer removal treatment to be performed to remove polymers from the wafer W. The temperature of TMAH is regulated at a first temperature level (e.g., 80° C.±1° C.) by the first heater 17. Therefore, TMAH having a temperature regulated at about 80° C. is supplied to the wafer W.

The chemical agent to be used for the polymer removal treatment is not limited to TMAH, but examples thereof include a liquid containing TMAH, a liquid containing an organic alkali, a liquid containing an organic acid, a liquid containing an inorganic acid and a liquid containing an ammonium hydrogen fluoride compound, which may be used either alone or in combination. Examples of the organic alkali include DMF (dimethylforamide), DMSO (dimethyl sulfoxide), hydroxylamine and choline, which may be used either alone or in combination. Examples of the organic acid include citric acid, oxalic acid, imino diacids and succinic acid, which may be used either alone or in combination. Examples of the inorganic acid include hydrofluoric acid and phosphoric acid, which may be used either alone or in combination. Other examples of the chemical agent for the polymer removal treatment include liquids which contain at least one of 1-methyl-2-pyrrolidone, tetrahydrothiophene 1,1-dioxide, isopropanolamine, monoethanolamine, 2-(2-aminoethoxy)ethanol, catechol, N-methylpyrrolidone, aromatic diols, perchlene (tetrachloroethylene) and phenols. Specific examples of the chemical agent for the polymer removal treatment include a mixture liquid of 1-methyl-2-pyrrolidone, tetrahydrothiophene 1,1-dioxide and isopropanolamine, a mixture liquid of dimethyl sulfoxide and monoethanolamine, a mixture liquid of 2-(2-aminoethoxy)ethanol, hydroxylamine and catechol, a mixture liquid of 2-(2-aminoethoxy)ethanol and N-methylpyrrolidone, a mixture liquid of monoethanolamine, water and any of the aromatic diols, and a mixture liquid of perchlene and any of the phenols. Further other examples of the chemical agent include liquids which contain at least one of amines such as triethanolamine and pentamethyldiethylenetriamine, propylene glycol, and dipropylene glycol monomethyl ether.

Other examples of the chemical agent having an improved treatment capability at a higher temperature include SC-1 (a mixture liquid of ammonia and a hydrogen peroxide solution), and SC-2 (a mixture liquid of hydrochloric acid and a hydrogen peroxide solution). SC-1 is a chemical agent to be used for a cleaning process to remove unwanted substances such as particles and metal impurities, while SC-2 is a chemical agent to be used for a cleaning or etching process to remove unwanted substances such as particles and metal impurities. These chemical agents are each temperature-regulated, for example, at 40° C. to 60° C.

The chemical agent supplied to the wafer W from the chemical agent nozzle 5 (TMAH having a temperature regulated at 80° C.±1° C. in this exemplary treatment) flows out from the periphery of the wafer W and is received in the cup 7. Then, the chemical agent is introduced into the second tank 14 through the chemical agent recovery pipe 16, and recovered. At this time, the temperature of the recovered chemical agent is, for example, 25° C. to 30° C. That is, heat is removed from the chemical agent spouted from the chemical agent nozzle 5 by the wafer W and the ambient room-temperature environment before the chemical agent reaches the second tank 14 and, when the chemical agent is recovered in the second tank 14, the temperature of the chemical agent is lowered to around the room temperature.

After the chemical agent treatment is performed for a predetermined period, the control section 43 closes the chemical agent valve 20 to stop the supply of the chemical agent from the chemical agent supply apparatus 12 to the chemical agent nozzle 5. Thus, the spouting of the chemical agent from the chemical agent nozzle 5 is stopped. Then, deionized water as an exemplary rinse liquid is spouted from the rinse liquid nozzle 6, and applied onto a portion of the upper surface of the wafer W including the rotation center. The deionized water applied onto the wafer W receives a centrifugal force generated by the rotation of the wafer W to spread toward the periphery of the wafer W. Thus, a rinsing process is performed to rinse away the chemical agent from the wafer W with the deionized water.

After the rinsing process is thus performed for a certain period of time, the supply of the deionized water is stopped, and the spin chuck 4 is rotated at a higher speed by the rotative drive mechanism 9 to perform a drying process to dry the wafer W. After the drying process, the treated wafer W is transported out of the treatment unit 2 by the substrate transport robot.

FIG. 3 is a flow chart for explaining a chemical agent replenishment process for replenishing the first tank 13 with the chemical agent in the chemical agent supply apparatus 12.

When the chemical agent is recovered from the cup 7 of the substrate treatment apparatus 1 into the second tank 14 through the chemical agent recovery pipe 16 (Step S1), the chemical agent is stored in the second tank 14. The temperature of the recovered chemical agent is, for example, lower than the temperature (first temperature level) of the chemical agent pumped out of the first tank 13.

In turn, the chemical agent recovered in the second tank 14 is pumped out of the second tank 14 by the constantly driven second pump 26. If the liquid surface level in the first tank 13 is not lowered to the chemical agent replenishment surface level at this time, the control section 43 closes the transfer valve 28, and opens the second return valve 30. Therefore, the chemical agent pumped out of the second tank 14 is circulated through the second circulation passage 31, while being temperature-regulated by the second heater 25. Therefore, the chemical agent recovered in the second tank 14 is temperature-regulated at the second temperature level by the second heater 25 (Step S2) until the liquid surface level in the first tank 13 is lowered to the chemical agent replenishment surface level.

During the circulation of the chemical agent from the second tank 14 through the second circulation passage 31, the control section 43 judges, based on an input signal from the second lowest liquid surface level sensor 37b in the first tank 13, whether the first tank 13 is to be replenished with the chemical agent (Step S3). That is, if the signal is continuously inputted to the control section 43 from the liquid surface level sensor 37b, the liquid surface level in the first tank 13 is not lowered to the chemical agent replenishment surface level (No in Step S3) and, therefore, the chemical agent from the second tank 14 is kept circulated without replenishment of the first tank 13 with the chemical agent.

On the other hand, if the liquid surface level in the first tank 13 is lowered to the chemical agent replenishment surface level and, therefore, the input signal from the liquid surface level sensor 37b is stopped (Yes in Step S3), the control section 43 closes the second return valve 30 and opens the transfer valve 28. Thus, the chemical agent is transferred from the second tank 14 to the first tank 13 by the second pump 26 to start replenishing the first tank 13 with the chemical agent (Step S4).

By the transfer of the chemical agent from the second tank 14 to the first tank 13, the recovered chemical agent is supplied to the first tank 13 from the second tank 14. Therefore, the chemical agent recovered from the substrate treatment apparatus 1 is supplied again to the chemical agent nozzle 5 from the first tank 13. Thus, the chemical agent supplied to the substrate treatment apparatus 1 is reused.

The chemical agent to be transferred from the second tank 14 to the first tank 13 is temperature-regulated by the second heater 25. Therefore, the temperature of the chemical agent to be transferred to the first tank 13 is regulated at the second temperature level, which is equal to or substantially equal to the first temperature level. Therefore, the reduction of the temperature of the chemical agent in the first tank 13 is suppressed or prevented, which may otherwise occur when the first tank 13 is replenished with the chemical agent transferred from the second tank 14. Even if the chemical agent is supplied to the chemical agent nozzle 5 from the first tank 13 immediately after the replenishment of the first tank 13 with the chemical agent, the chemical agent to be supplied to the chemical agent nozzle 5 is kept at the first temperature level that is suitable for the treatment of the wafer W. Thus, even if the treatment to be performed on the substrate is dependent upon the temperature of the chemical agent like the polymer removal treatment with TMAH, the substrate is properly treated. As a result, the substrate treatment failure is suppressed or prevented.

The chemical agent to be transferred from the second tank 14 to the first tank 13 is filtered by the second filter 27. Therefore, the chemical agent to be transferred to the first tank 13 is free from foreign matter such as particles. This suppresses or prevents the contamination of the first tank 13 with the foreign matter contained in the chemical agent. Further, the chemical agent containing the foreign matter is substantially prevented from being supplied from the first tank 13 to the chemical agent nozzle 5.

Upon the start of the replenishment of the first tank 13 with the chemical agent, the control section 43 judges whether the replenishment of the first tank 13 with the chemical agent is to be stopped (Step S5). That is, if no signal is inputted to the control section 43 from the third lowest liquid surface level sensor 37c in the first tank 13, the liquid surface level in the first tank 13 does not reach the chemical agent replenishment surface level (No in Step S5) and, therefore, the replenishment of the first tank 13 with the chemical agent is continued.

On the other hand, if the signal is inputted to the control section 43 from the liquid surface level sensor 37c with the liquid surface level reaching the chemical agent replenishment stop surface level in the first tank 13 (Yes in Step S5), the control section 43 closes the transfer valve 28, and opens the second return valve 30. Thus, the transfer of the chemical agent from the second tank 14 to the first tank 13 is stopped, whereby the replenishment of the first tank 13 with the chemical agent is stopped (Step S6). Then, the chemical agent from the second tank 14 is circulated again through the second circulation passage 31.

If the liquid surface level in the second tank 14 is lowered to the chemical agent replenishment surface level after the stop of the transfer of the chemical agent to the first tank 13, the second replenishment valve 35 provided in the second chemical agent replenishment pipe 34 is opened to replenish the second tank 14 with the fresh chemical agent. Then, the fresh chemical agent supplied into the second tank 14 is circulated through the second circulation passage 31 and temperature-regulated by the second heater 25 until the liquid surface level in the first tank 13 is lowered again to the chemical agent replenishment surface level. Therefore, even if the temperature of the fresh chemical agent is different from the first temperature level, the temperature change of the chemical agent in the first tank 13 is suppressed or prevented because the chemical agent to be transferred to the first tank 13 is temperature-regulated by the second heater 25.

In this embodiment, as described above, the chemical agent recovered from the substrate treatment apparatus 1 is stored in the second tank 14, and transferred to the first tank 13 after being temperature-regulated by the second heater 25. Therefore, even if the temperature of the recovered chemical agent is different from the first temperature level at which the chemical agent is temperature-regulated by the first heater 17, the chemical agent is transferred to the first tank 13 with its temperature being regulated by the second heater 25 at the second temperature level that is equal to or substantially equal to the first temperature level. Thus, the temperature change of the chemical agent in the first tank 13 is suppressed or prevented, which may otherwise occur due to the recovery of the chemical agent. Therefore, the temperature of the chemical agent to be supplied to the chemical agent nozzle 5 is stabilized, so that the chemical agent is supplied to the wafer W at a stable temperature. Therefore, even if the treatment of the wafer W is dependent upon the temperature of the chemical agent, the wafer W is properly treated.

Further, the fresh chemical agent is supplied to the first tank 13 via the second tank 14 during the continuous operation of the chemical agent supply apparatus 12. Therefore, even if the temperature of the fresh chemical agent is different from the first temperature level, the chemical agent is transferred to the first tank 13 with its temperature being regulated by the second heater 25 at the temperature level that is equal to or substantially equal to the first temperature level. Thus, the temperature change of the chemical agent in the first tank 13 is suppressed or prevented, which may otherwise occur due to the supply of the fresh chemical agent.

While the embodiment of the present invention has thus been described, the present invention is not restricted to the embodiment. Various modifications may be made within the scope of the appended claims. In the embodiment described above, the temperatures of the chemical agent in the first and second tanks 13, 14 are regulated by heating the chemical agent in the pipes (the chemical agent supply pipe 15 and the chemical agent transfer pipe 24) by the first and second heaters 17, 25 by way of example, but this arrangement is not limitative. That is, the first and second heaters 17, 25 may be respectively provided in the first and second tanks 13, 14 to regulate the temperatures of the chemical agent stored in the first and second tanks 13, 14.

In the embodiment described above, the second heater 25 is used as the second temperature regulating unit. Where the temperature of the chemical agent recovered in the second tank 14 is higher than the first temperature level, a cooling device such as a Peltier element or a cooling pipe mechanism may be used as the second temperature regulating unit. In the embodiment described above, the first heater 17 is used as the first temperature regulating unit. However, where the first temperature level is lower than the room temperature, for example, a cooling device such as a Peltier element or a cooling pipe mechanism is used as the first temperature regulating unit.

In the embodiment described above, the wafer W is used as the substrate to be treated, but the substrate is not limited to the wafer W. Other examples of the substrate to be treated include substrates for liquid crystal display devices, substrates for plasma display devices, substrates for FED devices, substrates for optical disks, substrates for magnetic disks, substrates for magneto-optical disks, and substrates for photo masks.

While the present invention has been described in detail by way of the embodiment thereof, it should be understood that the embodiment is merely illustrative of the technical principles of the present invention but not limitative of the invention. The spirit and scope of the present invention are to be limited only by the appended claims.

This application corresponds to Japanese Patent Application No. 2008-61057 filed in the Japanese Patent Office on Mar. 11, 2008, the disclosure of which is incorporated herein by reference in its entirety.

What is claimed is:

1. A substrate treatment apparatus comprising:
A) a treatment section for treatment of a substrate disposed therein, and
B) a treatment liquid supply apparatus which supplies a treatment liquid to the treatment section for treatment of the substrate with the treatment liquid, and recovers the supplied treatment liquid for reuse,
the treatment liquid supply apparatus comprising:
a first tank in which the treatment liquid to be supplied to the treatment section is stored;
a second tank in which the treatment liquid recovered from the treatment section is stored;
a treatment liquid supply pipe connected between the first tank and the treatment section;
a treatment liquid transfer pipe which transfers the treatment liquid directly from the second tank to the first tank;
a first temperature regulating unit which regulates a temperature of the treatment liquid to be supplied from the first tank to the treatment section through the treatment liquid supply pipe, said first temperature regulating unit being disposed either in the treatment liquid supply pipe or in the first tank;
a second temperature regulating unit which regulates a temperature of the treatment liquid to be transferred from the second tank to the first tank by the treatment liquid transfer pipe, said second temperature regulating unit being disposed either in the treatment liquid transfer pipe or in the second tank;
a fresh liquid replenishment unit which replenishes the second tank with a fresh treatment liquid through a replenishment pipe connected for feeding said treatment liquid to the second tank from a fresh treatment liquid source, said replenishment pipe being disposed away from and not connected for supplying said treatment liquid directly either to said first tank or to said treatment section for treatment of the substrate;
C) a first treatment liquid return pipe which is connected between said treatment section and said first tank providing a first recirculating path for said treatment liquid from said supply pipe back to said first tank;
D) a second treatment liquid return pipe which is branched from and connected to said treatment liquid transfer pipe at a location intermediate said second temperature regulating unit and said first tank, and connected to said second tank for providing a second recirculating path for said treatment liquid, the temperature of which has been regulated by the second temperature regulating unit, from said transfer pipe back to said second tank; and
E) a control section, wherein said control section is configured to
control the first temperature regulating unit to regulate the temperature of the treatment liquid in the first tank to a predetermined first temperature;
cause the treatment liquid supply apparatus to supply the treatment liquid in the first tank whose temperature has been regulated to the treatment section;
control the second temperature regulating unit to regulate the temperature of the treatment liquid in the second tank to a predetermined second temperature that is equal to or substantially equal to the first temperature; and
cause the treatment liquid supply apparatus to transfer the treatment liquid in the second tank whose temperature has been regulated to the first tank; control the supply of fresh treatment liquid to the first tank from the fresh treatment liquid source.

2. A substrate treatment apparatus according to claim 1, wherein the first and second temperature regulating units each regulate the temperature of the treatment liquid at a temperature level not lower than a room temperature of about 25° C.

3. A substrate treatment apparatus according to claim 1, wherein the treatment liquid supply apparatus further comprises a filter unit which filters the treatment liquid to be transferred from the second tank to the first tank by the transfer unit.

4. A substrate treatment apparatus according to claim 1, further comprising:
a substrate disposed in the treatment section.

5. A substrate treatment apparatus according to claim 1, wherein said treatment liquid is recovered from said treatment section by a recovery pipe connected between said treatment section and said second tank.

6. A substrate treatment apparatus according to claim 1, wherein
said treatment section comprises a spin chuck for holding and spinning said substrate; and
said treatment liquid supply apparatus comprises a supply pipe in said treatment section directed at said spin chuck for supplying said treatment liquid to said substrate, and a recovery pipe in said treatment section for recovering said treatment liquid.

7. A substrate treatment apparatus according to claim 1, wherein said treatment liquid return pipe is connected directly to said second tank for providing said second recirculating path for said treatment liquid.

* * * * *